United States Patent [19]

Culbert et al.

[11] Patent Number: 4,872,145

[45] Date of Patent: Oct. 3, 1989

[54] NOISE TRAP CIRCUIT

[75] Inventors: James A. Culbert, Hingham; Daniel M. Seslar, Weymouth, both of Mass.

[73] Assignee: Hazeltine Corporation, Greenlawn, N.Y.

[21] Appl. No.: 45,929

[22] Filed: May 4, 1987

[51] Int. Cl.[4] ............................................. G01S 9/66
[52] U.S. Cl. ..................................... 367/87; 367/901; 455/283
[58] Field of Search ................... 367/87, 13, 901, 105, 367/900, 903, 135; 340/572; 328/167; 307/547–551; 455/307, 251, 308, 283, 287

[56] References Cited

U.S. PATENT DOCUMENTS

| | | | |
|---|---|---|---|
| 3,558,917 | 1/1971 | Crouse | 307/547 X |
| 3,716,726 | 2/1973 | Trimble | 307/549 |
| 3,798,559 | 3/1974 | Tomita et al. | 307/549 |
| 4,035,734 | 7/1977 | Flormann et al. | 328/167 |
| 4,121,183 | 10/1978 | Murphy | 307/550 X |

Primary Examiner—Thomas H. Tarcza
Assistant Examiner—Tod Swann
Attorney, Agent, or Firm—E. A. Onders

[57] ABSTRACT

A noise trap circuit particularly suitable for use in an electro-acoustic system, operates to suppress low level signals or noise while allowing a relatively large signal to pass unattenuated between input and output terminals of the circuit. Blocking elements between the input and output terminals establish a high impedance path to the noise but switch to a conductive state when the large signals are present at the input terminals. Shunt elements across the output terminals provide a low resistance path or "crowbar" when only the noise is present at the input terminals, but switch to a non-conductive state when the large signals are sensed at the circuit input.

24 Claims, 9 Drawing Sheets

NOISE TRAP TWO
BANK OF TRANSFORMERS

A,B,C TRANSFORMER PRIMARIES ARE
DRIVEN FROM THE CONTROL AND
BIAS CIRCUIT. SECONDARIES ARE
CONNECTED TO XA, XB, AND XC
INPUTS ON THE NOISE TRAPS
AND THE SENSE CIRCUIT.

NOISE TRAP CIRCUIT

BACKGROUND OF THE INVENTION

1. Field of the Invention

The present invention relates generally to noise trap or filter circuits, and more particularly to a noise trap circuit including signal blocking elements between input and output terminals of the circuit and shunt elements at the output terminals, to suppress small signal or noise components of a signal applied to the input terminals while allowing large signals to pass unattenuated from the circuit input to its output.

2. Description of the Known Art

Noise rejection circuits of various forms are known. For example, in electronic security systems, U.S. Pat. Nos. 3,828,337 (Aug. 6, 1974) and 3,863,244 (Jan. 28, 1975) disclose noise rejection circuitry which serves to discriminate true signals radiated from a resonant tag when the tag is moved through a surveillance zone of a retail store, from noise signals the presence of which bear no relation to the induced radiation from the tag. The disclosed noise rejection circuitry is provided in the security systems at a stage where pulses which may correspond either to true signals or noise are produced, and the circuitry employs pulse discrimination techniques to ensure that an alarm is sounded only in response to the true signal.

U.S. Pat. No. 4,019,148 (Apr. 19, 1977) discloses a circuit capable of detecting an AC data signal in the presence of high level noise signals of the kind produced by acoustical telemetry systems employed in bore holes. An unfiltered AC signal is placed across a pair of capacitors which are alternately switched to ground at a rate corresponding to the period of the AC component of the input signal.

A noise rejection circuit for use in sonar locator apparatus is disclosed in U.S. Pat. No. 3,747,053 (July 17, 1973). Like the mentioned '337 and '244 patents, the operation of the circuit in the '053 patent is based on a pulse processing scheme wherein pulses produced in response to electromagnetic or acoustical noise are discriminated and rejected, thus leaving only those pulses representing true signals or echos to be decoded.

Another sort of noise problem has arisen, however, in modern electro-acoustic systems which employ a common array of transducers for transmitting ultrasonic waves toward an object and receiving echo waves reflected by the object. When each transducer element of the array is driven with a large drive signal from a high power amplifier, it has been found that relatively small signals or noise produced at the outputs of the power amplifiers when in a receive mode, will appear at the input channels to the system receiver. Since the output noise from the amplifiers may be at a level within the dynamic range and bandwidth of the receiver and exceed the output levels of the transducer elements in response to normal "sea noise", it is essential to suppress any noise at the outputs of the system amplifiers well below the sea noise level when in a receive mode of operation.

An object of the invention is to provide a circuit that can discriminate between large and small amplitude signals, and the circuit must be capable of passing the large signals and rejecting the small signals. It must be capable of switching reliably and quickly between reject and pass modes of operation so that a transmit signal of short duration will be passed. Because of the reliability and timing considerations, mechanical relays would not be suitable for the application this invention was intended. Also, because it is necessary to reject noise at the transmit signal frequencies in the small signal/noise blocking mode of operation and then pass those frequencies in the large signal/transmit mode of operation, a frequency selective filter is not suitable.

A noise trap circuit according to the invention includes input terminal means to connect with an input signal from a signal source which produces large signals and noise comprised of relatively small signals, output terminal means, blocking means connected between the input and the output terminal means to establish a high impedance path to the noise while establishing a low impedance path to the large signals from the signal source, shunt means associated with the output terminals for establishing a shunt which substantially attenuates the noise when the shunt is in an on state, but which allows the large signals to appear unattenuated at the output terminals when the shunt means is in an off state, and means coupled to the shunt means for sensing the large signals and for maintaining the shunt means in the on state in the absence of the large signals, and for maintaining the shunt means in the off state when the large signals are sensed. Accordingly, the large signals from the signal source are provided at the output terminal means absent said noise.

In one embodiment, the noise trap circuit includes first and second input terminals, and first and second output terminals. Blocking means connected between the first input and the first output terminal establishes a high impedance path to small signal noise, and provides a low impedance path to large signals. Shunt means connected between the first and the second output terminals establishes a low impedance shunt to the noise when the shunt means is in an on state, and allows the large signals to appear unattenuated at the output terminals when the shunt means is in an off state. Feedback means coupled to the shunt means senses the large signals in an input signal applied to the first input terminal, and maintains the shunt means in the on state in the absence of the large signals. When the large signals are sensed, the feedback means maintains the shunt means in the off state.

According to another embodiment, the present noise trap circuit includes first and second input terminals, and first and second output terminals. First blocking means is connected between the first input terminal and the first output terminal, and second blocking means is connected between the second input and the second output terminals. Both of the blocking means are arranged to establish high impedance paths between the associated input and output terminals to small signal noise in an input signal applied to the first and the second input terminals, and to establish low impedance paths between the associated input and output terminals to large signals applied to the first and the second input terminals. Shunt means connected between the first and second output terminals establishes a low impedance shunt between the output terminals to the small signal noise when the shunt means is in an on state, and allows the large signals to appear unattenuated at the output terminals when the shunt means is in off state. Control means coupled to the first and the second blocking means and to the shunt means, senses the large signals at the input terminals and controls operation of both blocking means and the state of the shunt means, according to whether or not the large signals are sensed.

A low noise electro-acoustic system according to the invention includes a plurality of electro-acoustic transducers forming an array to transmit an ultrasonic wave toward an object, and to receive corresponding echo waves reflected from the object. A number of power amplifier means each supplies a large drive signal to a different one of the transducers when in a transmit mode. Each power amplifier means produces noise comprised of relatively small signals at its output when in a receive mode. Receiver means having an input coupled to the transducer array detects the echo waves and provides information corresponding to the object location when in the receive mode. A number of noise trap means each coupled between a different one of the power amplifier means and an associated transducer, suppress the noise produced by each amplifier means when in the receive mode from appearing at the input of the receiver means. Each noise trap means includes input terminal means for connecting with an output of an associated power amplifier means, output terminal means, blocking means connected between the input and the output terminal means, to establish a high impedance to the noise produced by the amplifier means and to establish a low impedance path for the drive signals from the amplifier means, shunt means to establish a low impedance shunt and attenuate the noise at the output terminal means when the shunt means is in an on state, and for allowing the drive signals to appear unattenuated at the output terminal means when the shunt means is in an off state, and means coupled to the shunt means for sensing the drive signals, and for maintaining the shunt means in the on state in the absence of the drive signals while maintaining the shunt means in the off state when the drive signals are sensed.

The various features of novelty which characterize the invention are pointed out with particularity in the claims annexed to and forming a part of the present disclosure. For a better understanding of the invention, its operating advantages and specific objects attained by its use, reference should be had to the accompanying drawing and descriptive matter in which there ar illustrated and described preferred embodiments of the invention.

DETAILED DESCRIPTION OF THE INVENTION

Figure 1:
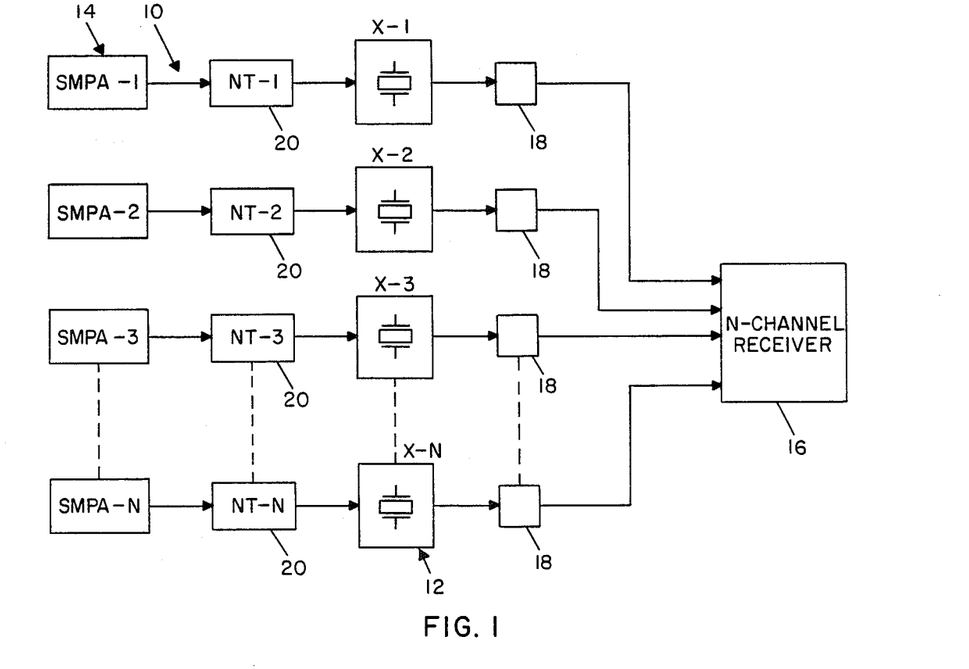
FIG. 1 is a schematic block diagram of an electroacoustic system which embodies the present invention.

FIG. 1 is a block diagram of an electroacoustic system 10 including a number of noise trap circuits NT-1, NT-2, NT-3 . . . NT-N according to the invention.

Basically, a single array or "stave" comprised of N piezoelectric transducer elements X-1, X-2, . . . X-N, is arranged for submersion in water to transmit a beam of ultrasonic wave energy through the water in a desired direction. The same array 12 also serves to receive ultrasonic echo waves when the transmitted beam is reflected off an object located in the direction of the beam.

In order to drive each of the transducer elements, power amplifier means 14 including a number of switching mode power amplifiers SMPA-1, SMPA-2, SMPA-3, . . . SMPA-N are each arranged to supply a relatively large drive signal to corresponding ones of the transducer elements of the array 12. An N channel receiver 16 has N inputs for detecting output signals produced by corresponding ones of the transducer elements in array 12 in response to acoustic echo waves. Suitable overload protection circuit means 18 are provided to protect the corresponding input of the receiver 16 from the large signals use to drive each of the transducer elements of array 12 in the transmit mode of operation.

It will be appreciated that the inputs of the receiver 16 are extremely sensitive, so as to enable faint echo signals produced by the transducer elements to be detected and processed into accurate information relating to the location and size of an object relative to the array 12. Any noise signals originating from sources other than the transducer elements will give rise to false object information which, understandably, cannot be tolerated in certain situations. Such noise signal levels must in some cases be suppressed below a level of only a few nanovolts ($10^{-9}$ volts) in order to stay below the levels of signals produced by the transducer elements in response to sea noise.

Figure 2:
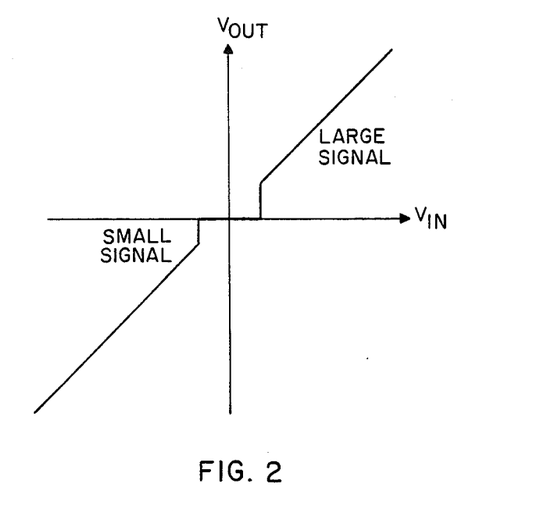
FIG. 2 is a graph of an ideal transfer function for noise trap means in the system of FIG. 1.

In order to isolate the inputs of receiver 16 from noise produced at the outputs of the power amplifier means 14 during a receive mode of operation, according to the invention a noise trap circuit 20 is inserted between the output of each power amplifier means SMPA-1, ·. . . SMPA-N and corresponding ones of the transducer elements of array 12. Ideally, the transfer characteristic of each noise trap circuit NT-1, NT-2, . . . NT-N is as shown in FIG. 2. That is, for small signals including noise known to be present in the power amplifier means outputs during the receive mode, each noise trap circuit 20 completely blocks transfer of the noise signals to the receiver inputs. When the power amplifier means 14 are in a transmit mode of operation and large drive signals are produced at their outputs for driving the transducer elements of array 12, however, each noise trap circuit 20 exhibits a linear transfer characteristic so that the drive signals reach the corresponding transducer elements without attenuation.

Figure 3:
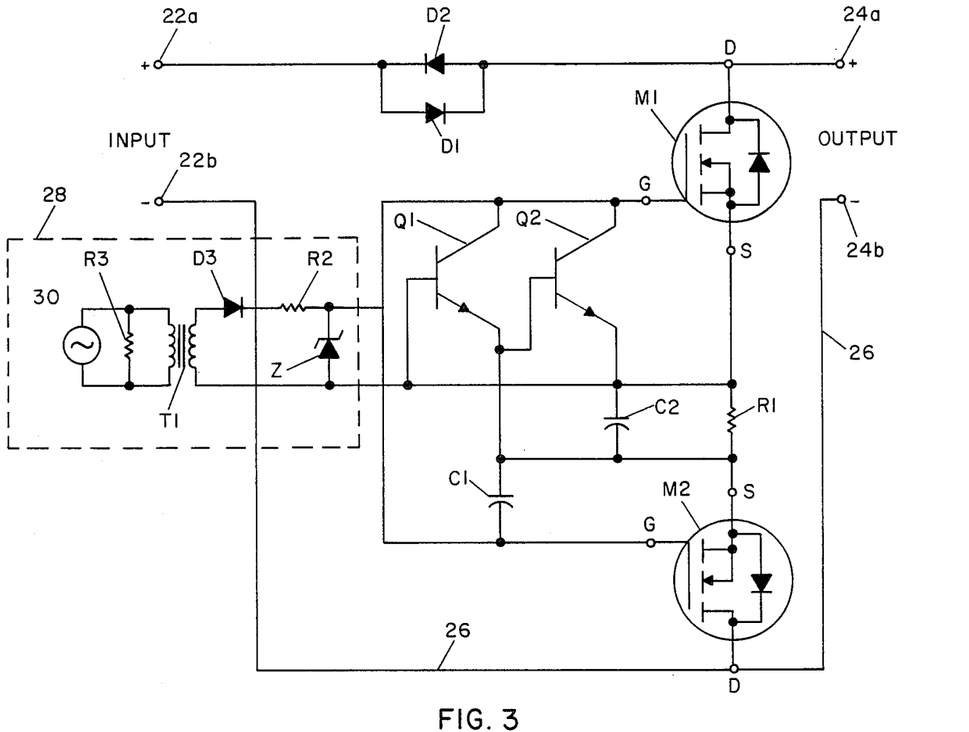
FIG. 3 is a schematic diagram of a first embodiment of a noise trap circuit according to the invention.

Structural details for one form of noise trap circuit according to the invention are shown in FIG. 3. The circuit includes a pair of input terminals 22a, 22b for connection with an associated switching mode power amplifier among the amplifier means 14 in FIG. 1. The circuit of FIG. 3 also includes a pair of output terminals 24a, 24b, and a pair of blocking diodes D1, D2 arranged between input terminal 22a and output terminal 24a. The diodes D1, D2 are connected in parallel relation, with an anode of one diode connected to a cathode of the other diode. Input terminal 22b is connected directly to output terminal 24b by a conductor 26.

An n channel enhancement mode field effect transistor (FET) M1 has its channel drain electrode connected to output terminal 24a. A similar type FET M2 has its channel drain electrode connected to output terminal 24b. A resistor R1 of relatively small value, e.g., 10 ohms, is connected between the channel source electrodes of the FETs M1, M2.

In a typical application, both diodes D1, D2 may be, e.g., type 1N5554. Both Fets M1, M2 may be, for example, types 2N6770.

A pair of npn bi-polar transistors Q1, Q2 each has a collector electrode connected to a gate electrode of FET M1. An emitter electrode of transistor Q1 is connected to the side of the resistor R1 which connects to the source electrode of FET M2. A base electrode of the transistor Q2 is connected to the same side of the resistor R1. A base electrode of transistor Q1 is connected to the other side of resistor R1 which connects to the source electrode of FET M1. An emitter electrode of the transistor Q2 is also connected to the other side of the resistor R1. Both transistors Q1, Q2 may be types 2N4124.

A floating, D.C. bias supply 28 includes a bias oscillator 30 capable of producing, for example, a 12 volt peak-to-peak AC signal in the audio frequency range (e.g., 2 KHz), a protective load resistor R3 (1K), and isolation transformer T1. A secondary output voltage of transformer T1 is half-wave rectified by a diode D3 (e.g., 1N5711) the cathode of which is connected to one side of a series loading resistor R2 (e.g., 100 K). The other side of resistor R2 connects to a cathode terminal of a zener diode Z the anode of which connects to a remaining secondary output of transformer T1 so that a biasing D.C. voltage of, for example, 10 volts may be obtained across the terminals of the zener diode Z. The cathode of zener diode Z connects to the gate electrodes of the FETs M1 and M2, and the anode of diode Z connects to the other side of the resistor R1, i.e., the side of resistor R1 connected to the source electrode of FET M1. Diode Z may be device type 1N4744.

A capacitor C1 (1uF) is connected between the gate and source electrodes of FET M2, and a second capacitor C2 (0.47uF) is connected across resistor R1.

Operation of the noise trap circuit in FIG. 3 will now be explained. As mentioned, when the system of FIG. 1 is in a receive mode, only relatively small signals comprised of noise at the outputs of the power amplifier means 14 will appear at the input terminals 22a, 22b. Such small signals are blocked by the high impedance of diodes D1, D2 when the signals are below the threshold voltages (0.6 volts) for the diodes. Further, both FETs M1 and M2 are biased on due to positive gate-to-source bias voltages established by the D.C. bias supply 28. A low impedance shunt formed by FETs M1 and M2 and resistor R1 thus appears across the output terminals 24a and 24b. An extreme voltage divider is therefore established between the circuit input and output, as expressed by:

$$\frac{V_{out}}{V_{in}} \quad \frac{Z \text{ shunt}}{Z \text{ shunt} + Z \text{ diodes}} \quad (1)$$

When the system of FIG. 1 is in a transmit mode, a large positive level drive signal at the input terminals 22a, 22b will be passed by the relatively low "on" impedance of diode D1. As the current through FETs M1 and M2, and resistor R1 increases, a voltage is developed across the resistor R1. Such voltage reflects as a positive base-to-emitter voltage at transistor Q1. When this voltage reaches about 0.6 volts, Q1 is turned on and the gate-to-source voltage of M1 is pulled toward VCE of Q1 minus the voltage drop across R1, thus.

$$VGS1 = VCE(Q1) - IR1$$
$$.2 - .6 = -.4 \text{ volts} \quad (2)$$

The channel of FET M1 is closed and the small signal shunt path previously existing across output terminals 24a, 24b is extinguished.

Likewise, a large negative amplitude signal at the input terminals 22a, 22b will be passed by diode D2 and the current through resistor R1 will develop a positive VBE for Q2. When that voltage reaches about 0.6 volts, Q2 is turned on and the gate-to- source voltage of FET M2 is pulled toward VCE of transistor Q2 minus the voltage drop across R1, thus.

$$VGS2 = VCE (Q2) - \varepsilon IR1 \varepsilon \quad (3)$$

As before, the channel of FET M2 is closed to extinguish the shunt across output terminals 24a, 24b.

It will be understood that the parallel impedance of resistor R1 and capacitor C2 serve as feedback means to sense the relatively large drive signals reaching the drains of M1 and M2, and for causing the FETs to be switched between on and off states, accordingly. Since closing either FET channel will block current through R1 which, in turn, controls the transistors Q1, Q2, the feedback loop is complete. In operation, voltage feedback levels are preferably such as to maintain VGS of the FETs at about threshold voltage so that only sufficient current is passed to control Q1 and Q2.

In the bias voltage supply 28, zener diode Z protects the FETs from overvoltage between the gate and source electrodes. Resistor R2 and capacitor C1 limit the recovery time of the bias voltage supply to minimize crossover distortion in large signal operation. Capacitor C2 and resistor R1 provide a complex feedback impedance that makes the switching threshold a function of input signal frequency as well as amplitude. Capacitor C2 also improves the high frequency noise rejection performance by reducing the shunt impedance Z shunt at high frequencies. The bias voltage supply 28 should maintain VGS×VGS (threshold) for small signal operation, and allow the feedback control to regulate VGS at approximately VGS (threshold) for the large signals.

The noise trap circuit of FIG. 3 as described herein was constructed and tested. A maximum rejection of 73 dB was obtained for small signals at 25 KHz; and 69 dB rejection was realized for small signals at 200 KHz.

It is not necessary to provide a separate bias oscillator 30, resistor R3 and transformer T1 for each noise trap circuit incorporated in the system of FIG. 1. A single transformer having N secondary windings connected through a cable to each of the N noise trap circuits 20 in FIG. 1, can have one primary winding driven by a single bias oscillator 30.

Further experimental results obtained with a noise trap circuit constructed as in FIG. 3 are set out in Tables 1 and 2 below. Input signal rejections obtained for an input signal at 25kHz between levels of −20 dBv to 20 dBv are set out in Table 1. The rejection obtained by the noise trap circuit of FIG. 3 to small signals of −20 dBv at frequencies ranging from 7 to 95 kHz are shown in Table 2.

TABLE 1

| INPUT SIGNAL FREQUENCY = 25 kHz | |
|---|---|
| RMS INPUT LEVEL (0dBv=1 volt) | NOISE TRAP REJECTION (Vout - Vin) |
| −20 dBv | −66.5 dB |
| 0 dBv | −7.9 dB |
| +10 dBv | −0.7 dB |
| +20 dBv | 0.0 dB |

TABLE 2

| SMALL SIGNAL(−20 dBv) REJECTION | |
|---|---|
| FREQUENCY | REJECTION |
| 7 kHz | −72.7 dB |
| 20 kHz | −65.5 dB |
| 50 kHz | −61.7 dB |
| 95 kHz | −61.6 dB |

Feedback means other than the resistor R1 may be employed in the circuit of FIG. 3, thus allowing the source electrodes of FETs M1 and M2 to be connected directly to one another and provide a lower "crowbar" shunt impedance across output terminals 24a and 24b when the FETs are biased in an on state in the absence of large drive signals at input terminals 22a, 22b. For example, a current sensing transformer can be arranged with a primary winding connected in series between input terminal 22a and the blocking diodes D1, D2. An output from a secondary winding of such current sensing transformer can be rectified to produce a voltage corresponding to that obtained across the resistor R1 as the input signal level increases above the noise threshold. Such a scheme also would enable bias control transistors Q1, Q2 to turn off the shunt FETs M1, M2 simultaneously, rather than alternately on positive and negative half cycles. Moreover, such a current sensing transformer and associated rectifying circuitry can be constructed as a band pass filter, thus enhancing rejection of noise signals not in the operating frequency range of the transducer array 12.

Although n type enhancement mode FETs are shown for M1 and M2, one skilled in the art would be able to adapt p type and/or depletion mode FETs for the components M1, M2 in the circuit of FIG. 3.

While the noise trap circuits disclosed herein are shown embodied in an electro-acoustic system, they may be applied in other AF/RF signal processing systems where low noise must be maintained.

Figure 4:
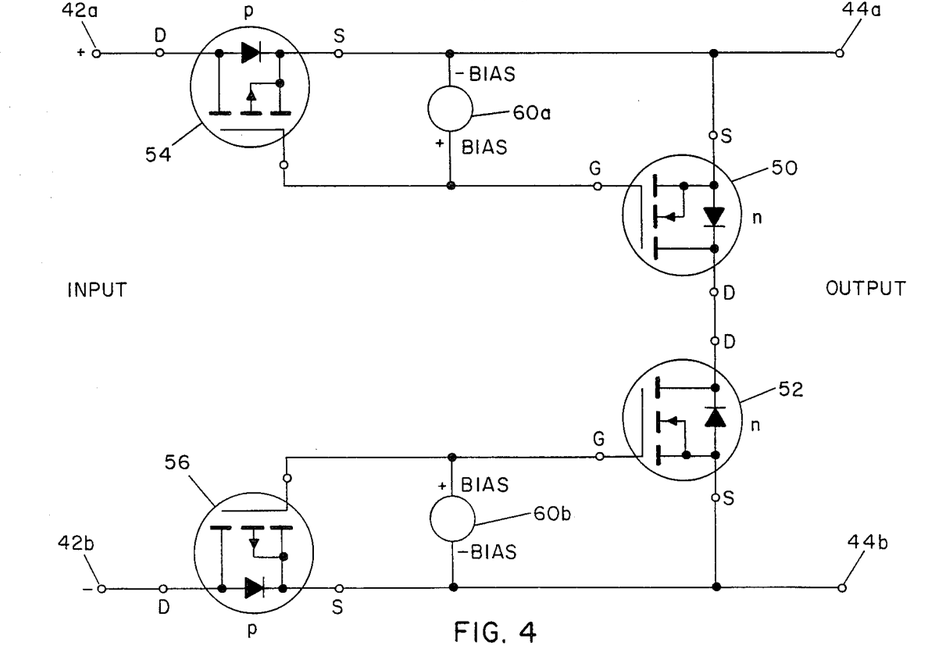
FIG. 4 is a schematic diagram of a second embodiment of a noise trap circuit according to the invention.
Figure 5:
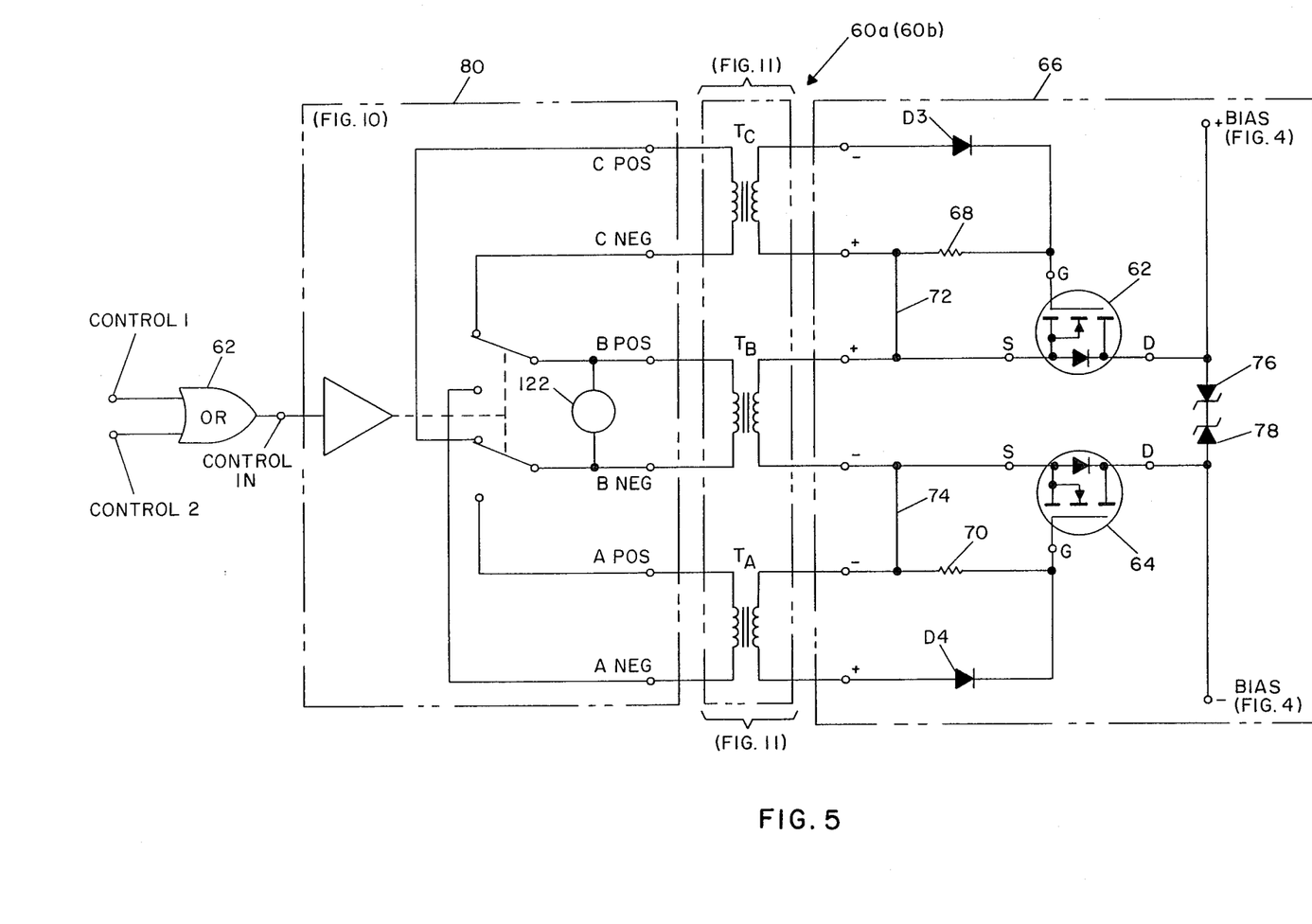
FIG. 5 is a schematic diagram of bias means employed in the circuit of FIG. 4.

FIGS. 4 and 5 show details of a second embodiment of a noise trap circuit according to the invention. The second embodiment was found to provide a greater range linear transfer characteristic so as to pass signals to drive the transducer element array 12 at low transmit power levels. A noise trap circuit constructed as in FIG. 4 was tested and found to provide 60 dB of dynamic range linearity.

To achieve greater linearity the diodes D1, D2 in the trap circuit of FIG. 3 were omitted. Also, the resistor R1 which serves as feedback means in the circuit of FIG. 3, was omitted in the FIG. 4 embodiment so as to improve noise performance.

Figure 12:
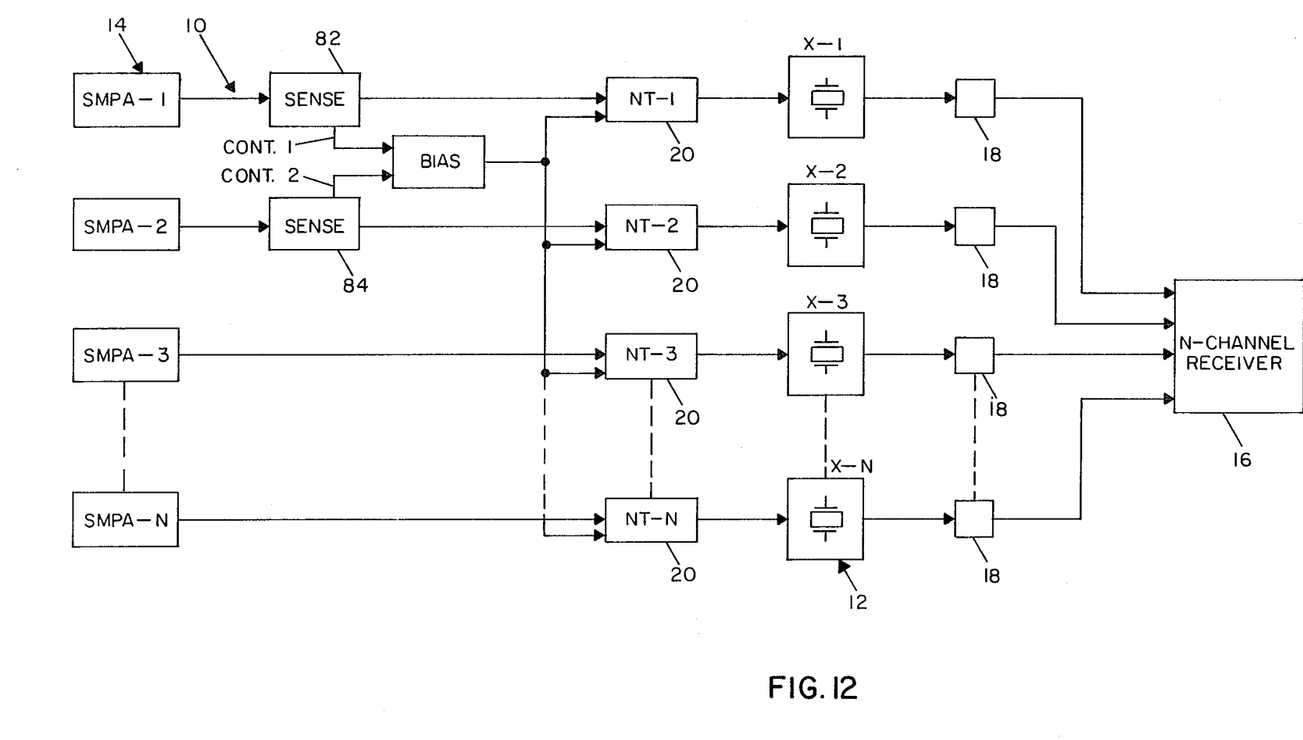
FIG. 12 is a schematic block diagram of an electroacoustic system according to a second embodiment of the invention.

In FIG. 4, a pair of input terminals 42a, 42b are provided for coupling to a corresponding output of power amplifier means 14' in an electro-acoustic system 10' shown in FIG. 12. A number N of noise trap circuits 20' corresponding to the circuit of FIG. 4 couple drive signals from each of the power amplifier means 14' to an array 12' of N transducer eleminxs, and serve to block noise present at the power amplifier means outputs during a receive mode from appearing at inputs of an N channel receiver 16'.

The circuit of FIG. 4 includes a pair of output terminals 44a, 44b, a p type FET 54 (IRFD 9120) having a drain electrode connected to input terminal 42a and a source electrode connected to output terminal 44a, and a second p type FET 56 (IRFD 9120) with a drain electrode connected to input terminal 42b and a source electrode connected to output terminal 44b. A pair of n type FETs 50, 52 each has a drain electrode connected directly to a drain electrode of the other. A source electrode of FET 50 is connected directly to output terminal 44a, and a source electrode of FET 52 is connected directly to output terminal 44b. FETs 50, 52 may be, for device type IRF 740.

A controlled bias voltage supply 60a has a positive output terminal connected directly to gate electrodes of the FETs 50 and 54, and a negative output terminal connected directly to the source electrodes of FETs 50, 54. A similar controlled bias voltage supply 60b is connected in like fashion between the gate and source electrodes of FETs 52 and 56.

FIG. 5 shows details of the bias voltage supplies 60a (or 60b) associated with the FETs 50, 52, 54 and 56 in FIG. 4. Basically, the supplies 60a, 60b serve as floating, switchable (+V to −V) supplies responsive to either of two control signals CONTROL 1 and CONTROL 2 received through an OR gate 62. The control signals are produced by sense and control circuits described later in connection with FIGS. 6 and 7. Also, as discussed below in connection with FIG. 11, transformers $T_A$, $T_B$ and $T_C$ can be in? the form of a single bank of three transformers with a sufficient number of secondary windings to energize a pair of FETs 62, 64 included in each of the bias voltage supplies 60a, 60b. That is, as shown in FIG. 12, each of the N noise trap circuits 20' may be comprised of the circuit of FIG. 4 including only a pair of bias voltage rectifier and supply portions 66 as outlined in FIG. 5. Each bias rectifier and supply portion 66 includes a pair of rectifier diodes D3, D4 the anodes of which are connected to a corresponding secondary winding output of the transformers $T_A$, $T_C$ and the cathodes of which are connected to corresponding gate electrodes of the FETs 62, 64. Diodes D3, D4 can be type 1N4001, and the FETs 62, 64 can be, e.g., types IRFD 120. The source electrode of FET 62 connects to one side of a secondary winding of transformer $T_B$. A bias resistor 68 (20K) is connected between the electrode of FET 64 connects to the other side of the secondary winding of transformer $T_B$.

A bias resistor 68 (20K) is connected between the gate electrode of FET 62 and the remaining side of the secondary winding of transformer $T_C$. Another bias resistor 70 is connected between the gate electrode of FET 64 and the remaining side of the secondary winding of transformer T$_A$. Jumpers 72, 74 connect the source electrodes of FETs 62, 64 to the side of the resistors 68, 70 which are connected to the secondaries of transformers T$_C$ and T$_A$, as shown in FIG. 5.

A pair of zener diodes 76, 78 (1N758) are connected cathode-to-cathode, and the anodes of diodes 76,78 are connected to corresponding drain electrodes of FETs 62, 64. The anode of diode 76 corresponds to the + bias terminal and the anode of diode 78 corresponds to the −bias terminal of the bias voltage supply 60a (or 60b) shown in the circuit of FIG. 4.

A switched, AC primary winding supply portion 80 of the bias voltage supply of FIG. 5, is described in further detail in connection with FIG. 10.

Figure 6:
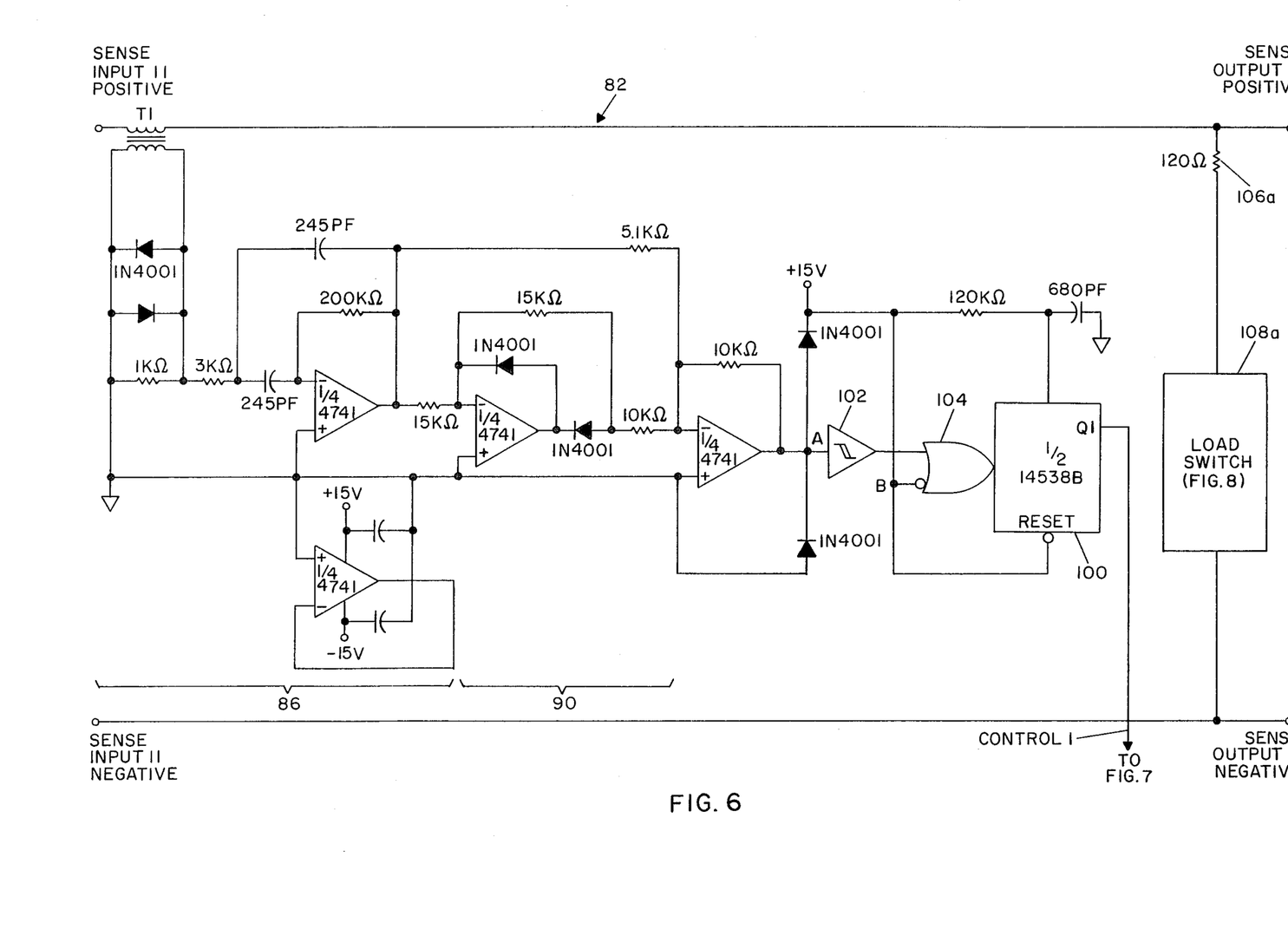
FIG. 6 is a schematic diagram of a first sense circuit for use with the noise trap circuit of FIG. 4.
Figure 9:
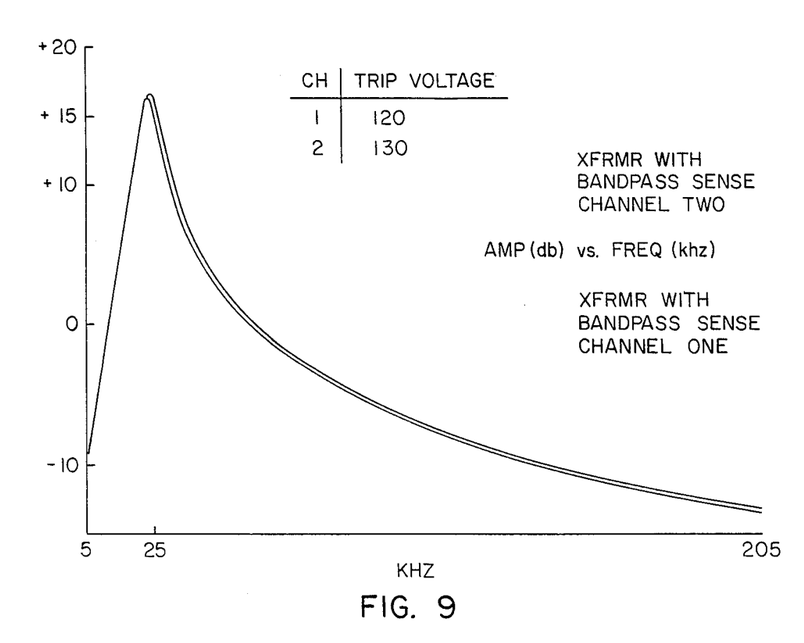
FIG. 9 shows bandpass characteristics of the sense circuits of FIGS. 6 and 7.

As shown in FIG. 12, only two sense circuits 82 and 84 are connected to outputs of two corresponding power amplifier means 14'. Although the two circuits 82, 84 are shown connected to amplifiers SMPA-1 and SMPA-2, sense circuits 82, 84 may be connected to the outputs of a different pair of the amplifier means 14', so long as all amplifier means 14' are controlled to operate in either a transmit or a receive mode simultaneously. Sense circuit 82 provides signal CONTROL 1 to the OR gate 62 in FIG. 5, and sense circuit 84 provides signal CONTROL 2, when either of the circuits 82, 84 senses a drive signal from an associated output of the amplifier means 14'. Details of sense circuit 82 are shown in FIG. 6, and the sense circuit 84 is shown in detail in FIG. 7. As shown, sensing is performed through current sensing transformers T1 in the circuit of FIG. 6, and T2 in the FIG. 7 circuit. The drive signals are inductively coupled through transformers T1, T2 to bandpass filter stages 86, 88. A typical sense circuit bandpass response provided by these stages 86, 88 is shown in FIG. 9. By making the sense circuits 82, 84 frequency dependent, it is possible to provide a lower sense threshold to signals at frequencies within the range of the drive signal frequency (or frequencies), and impose a higher threshold for signals of different frequencies which likely represent only noise.

Figure 7:
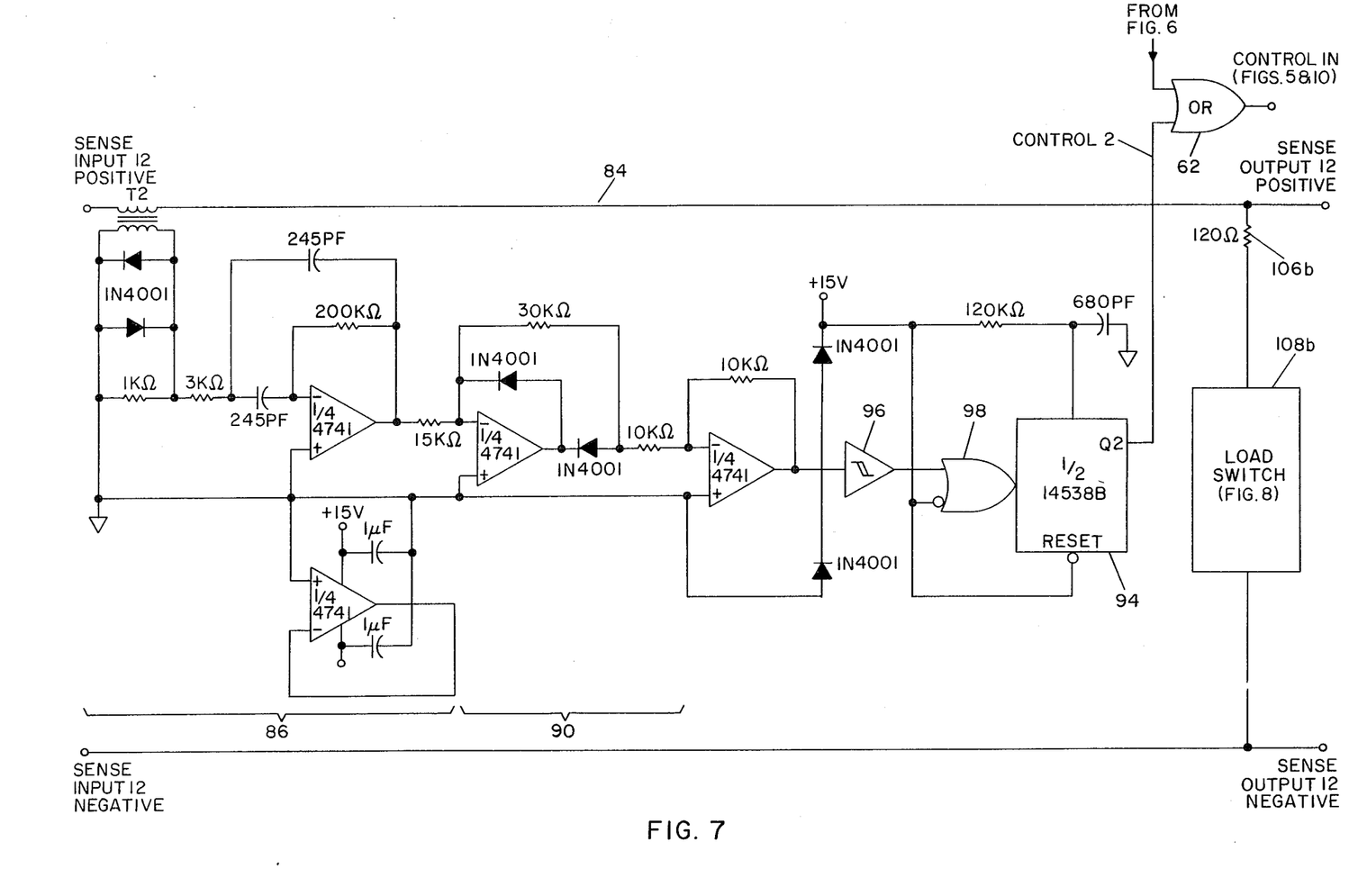
FIG. 7 is a schematic diagram of a second sense circuit for use with the noise trap circuit of FIG. 4.

For example, a trigger threshold may be set for the sense circuits of FIGS. 6 and 7 to be at −21.4 dBv at 25 KHz. Thus, a signal at 25 KHz which is greater than or equals −21.4 dBv will cause either or both of the sense circuits 82, 84 to produce signals CONTROL 1 and/or CONTROL 2 which, in turn, will cause each of the noise trap circuits 20' in FIG. 12 to pass the signal. Signals at the inputs of sense circuits 82, 84 which are less than −21.4 dBv will be rejected by the noise trap circuits 20'.

Sense circuit 82 includes a full wave rectifier stage 90 coupled to the output of bandpass filter stage 86 as shown in FIG. 6, and sense circuit 84 has a half wave rectifier stage 92 coupled to the output of bandpass filter stage 88 as in FIG. 7. Thus, when the full wave rectifier stage 90 is saturated, the half wave rectifier 92 provides a rising edge at its output to trigger a monostable multi-vibrator 94 through Schmitt trigger 96 and an OR gate 98. The full wave rectifier stage 90 in the sense circuit 82 ensures that a first half period of a drive signal output from power amplifier means 14' will trigger a monostable multi-vibrator 100 through Schmitt trigger 102 and OR gate 104 to provide signal CONTROL 1 for either a positive or negative half cycle of the drive signal.

A load resistor 106a (120 ohms) is connected at one side to a positive output terminal of the sense circuit 82, and connects at the other side to a terminal of a load switch circuit 108a. A remaining terminal of the switch circuit 108a connects to a negative output terminal of sense circuit 82. Likewise, a load resistor 106b is connected at one side to a positive output terminal of the sense circuit 84 in FIG. 7, and connects at the other side to a terminal of load switch circuit 108b. A remaining terminal of switch circuit 108b connects to a negative output terminal of sense circuit 84. Both load switch circuits 108a, 108b may be in a form shown in FIG. 8.

Figure 8:
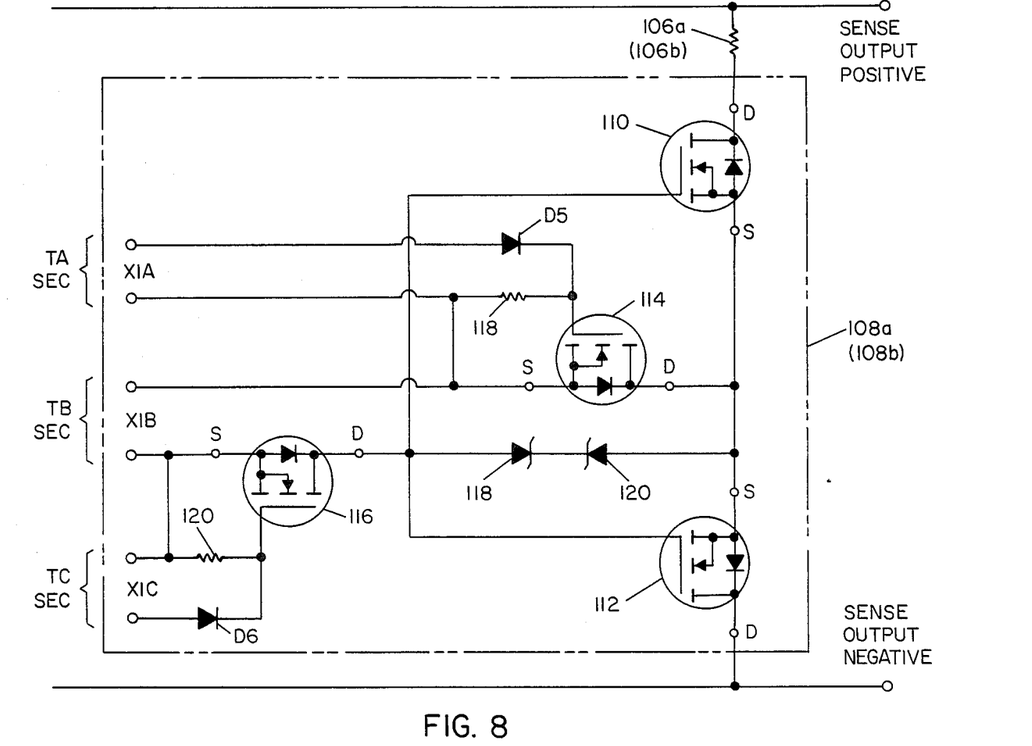
FIG. 8 is a schematic diagram of a load switch for use at each output of the sense circuits of FIGS. 6 and 7.

The load switch circuits 108a, 108b provide a "crowbar" to connect the load resistors 106a, 106b across the output terminals of the sense circuits 82, 84 in the absence of a drive signal at the sense circuit input terminals. A value for the resistors 106a, 106b of, for example, 120 ohms will therefore reflect through the primary winding of the sensing transformers T1, T2 and appear as a match impedance for the outputs of the corresponding power amplifier means 14'. This is important in determining a proper drive signal threshold level for causing sense circuits 82, 84 to trigger. Also, the sense circuit load resistors 106a, 106b provide current paths for the primaries of the transformers T1, T2 when the load switch circuits 108a, 108b are in a closed state in the absence of drive signals from the associated power amplifier means 14'.

As shown in FIG. 8, each load switch circuit 108a, 108b includes a pair of FETs 110, 112 (e.g., IRF 740) each with a source electrode connected directly to a source electrode of the other. A drain electrode of FET 112 connects directly to the associated sense circuit negative output terminal. A drain electrode of FET 110 connects to the other side of the associated load resistor 106a or 106b. A first bias control FET 114 has a drain electrode connected directly to the source electrodes of FETs 110, 112. A second bias control FET 116 has a drain electrode connected to an anode of one of a pair of Zener diodes 118, 120 connected cathode-to-cathode with one another. The anode of the other Zener diode 120 connects directly to the source electrodes of FETs 110, 112. A gate electrode of control FET 114 connects the cathode of a rectifier diode D5, and a gate electrode of FET 116 connects to the cathode of a rectifier diode D6. The FETs 114, 116 may be types IRFD 120, and the diodes D5, D6 may be, e.g., type 1N4001.

A bias resistor 118 is connected between the gate and source electrodes of FET 114, and another bias resistor 120 is connected between the gate and source electrodes of FET 116. Resistors 118, 120 may each be 20K. Gate electrodes of the FETs 110, 112 are directly connected to one another, and to the drain electrode of bias control FET 116. The series connected FETs 110, 112 are switched between closed and open states by way of the common transformer bank including transformers T$_A$, T$_B$ and T$_C$ shown in FIGS. 5 and 11. The source electrodes of bias control FETs 114, 116 are connected across a secondary winding of transformer T$_B$. As shown in FIGS. 5 and 10, the primary of transformer T$_B$ is continuously energized by a bias oscillator 122. The anode of diode D5 is connected to one side of a secondary winding of transformer T$_A$. The other end of resistor 118 and the source electrode of FET 114 are connected together and to a remaining side of the secondary winding of transformer T$_A$. The anode of diode D6 is connected to one side of a secondary winding of transformer T$_C$. The remaining end of resistor 120 and the source electrode of FET 116 are connected together and to a remaining side of the transformer T$_C$ secondary winding. Relative phase relationships among the secondary windings connected to terminals of the switch circuit 108a or 108b are as shown in FIG. 8.

Figure 10:
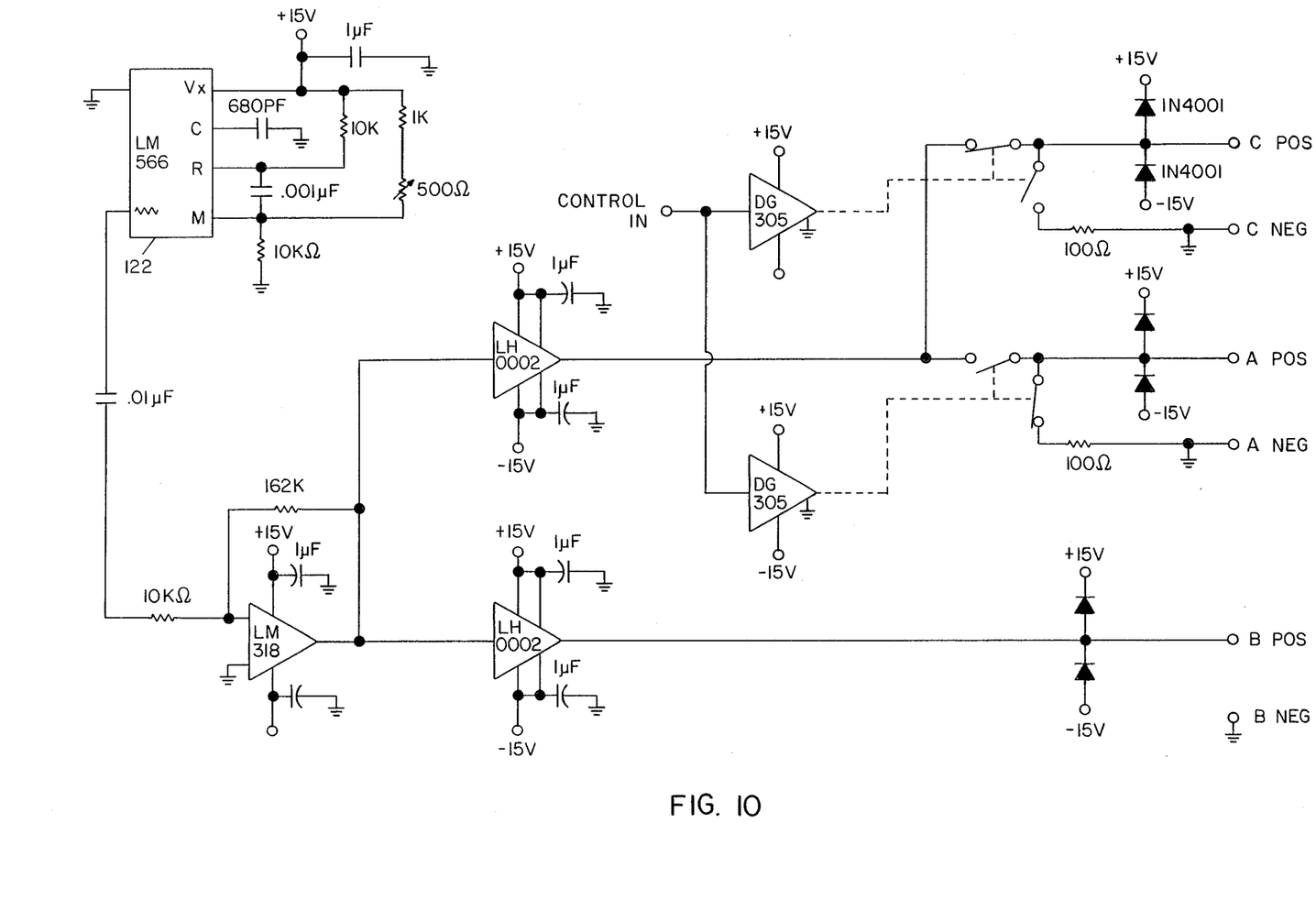
FIG. 10 is a schematic diagram of a switched AC primary winding supply for exciting a bias transformer bank.

It will be understood from FIGS. 5 and 10 that in the absence of either signal CONTROL 1 or 2, a primary of transformer $T_C$ is energized and transformer $T_A$ is not energized by bias oscillator 122. Thus, FET 116 is turned on in response to a positive VGS developed by diode D6 and resistor 120 in response to an AC voltage from the secondary of transformer $T_C$. Since an AC signal always is provided by the secondary of $T_B$, a positive VGS is established for FETs 110 and 112 across the zener diodes 118, 120, to switch FETs 110, 112 both on. When a drive signal is sensed and a control signal switches the AC primary winding supply portion 80 shown in FIGS. 5 and 10, the $T_C$ secondary output is extinguished and a secondary output is provided by $T_A N$ FET 114 is then gated on by the action of diode D5 and resistor 118, and a negative VGS is established for the FETs 110, 112. Thus, the load resistors 106a and 106b are removed from across the output terminals of the sense circuits 82, 84, and drive signals from the associated power amplifier means 14' pass directly to the inputs of the noise trap circuits 20' connected in line with the sense circuits 82, 84 as shown in FIG. 12.

Figure 11A:
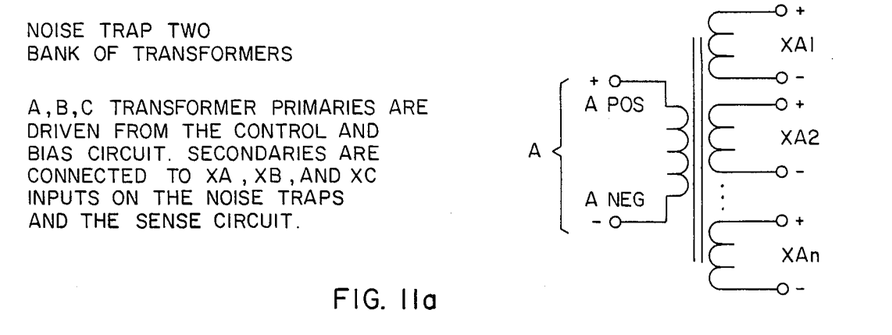
FIGS. 11a–11c are a schematic representation of a transformer bank for providing multiple operating bias voltages to a number of the noise trap circuits of FIG. 4 when embodied in an electro-acoustic system as in FIG. 12.
Figure 11B:
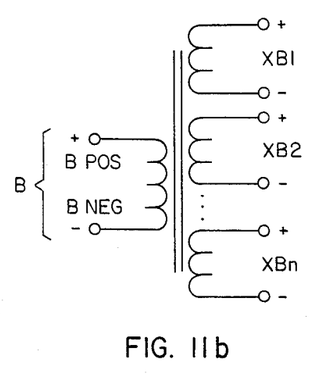
Figure 11C:
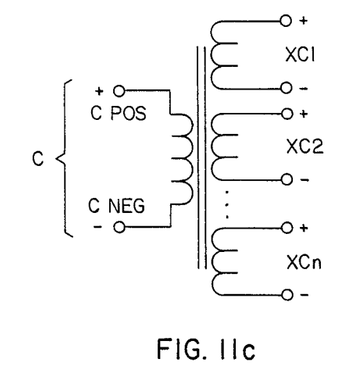

As mentioned, the bias voltage supplies 60a, 60b for each of the noise trap circuits 20' (see FIGS. 4 and 5) are connected to the common transformer bank of FIG. 11. In the absence of either signal CONTROL 1 or 2, the secondaries of transformers $T_B$ and $T_C$ produce AC signals. FET 62 in each bias voltage rectifier and supply portion 66 (FIG. 5) is gated on by the $T_C$ secondary voltage which is rectified by diode D3. A positive VGS is thus established for the shunt FETs 50, 52 to open their channels, while the same positive VGS is established for FETs 54, 56 to pinch their channels off and block noise signals appearing at input terminals 42a, 42b. When a drive signal is sensed by the circuits 82, 84 and a control signal is triggered, the $T_C$ secondary is extinguished and AC voltages are present at the $T_B$ and $T_A$ secondaries. Accordingly, FET 64 is gated on by diode D4, and a negative VGS is provided for the FETs 50, 52 to close their channels, i.e., produce an open circuit across output terminals 44a, 44b of the circuit in FIG. 4. Resistor 68 and resistor 70 discharge the gate to source capacitance of FET 62 and 64 respectively when bias oscillator is removed. The negative VGS is also provided for FETs 54, 56 which serves to open their channels and allow drive signals appearing at input terminal 42a, 42b to appear substantially unattenuated at output terminals 44a, 44b.

It has been found that to minimize feed-through of signals from bias oscillator 122 which may be operating at, e.g., 300 KHz, the secondary connections from the transformers to the bias voltage rectifier and supply portion 66 in FIG. 5 must be phased as shown in the drawing, so as to minimize the voltage between the gate electrodes of FETs 50 and 52. That is, pulses used to charge the gate electrodes should be equal in magnitude and in-phase so that there is no differential voltage gate-to-gate or source-to-source.

A noise trap constructed according to FIG. 4 yielded 79 dB of rejection at 25 KHz, with rejection decreasing at 6 dB per octive. Low drive transmit linearity was demonstrated down to −60 dB drive. Table 3 below shows a measured transfer characteristic for the circuit of FIG. 4 at levels from −36 dB to −60 dB drive at 25 KHz.

TABLE 3

| Relative Drive Level | Input | Output |
| --- | --- | --- |
| −60 dB | −18.7 dBv | −18.4 dBv |
| −54 dB | −12.8 dBv | −12.5 dBv |
| −48 dB | −6.8 dBv | −6.5 dBv |
| −42 dB | −0.7 dBv | −0.6 dBv |
| −36 dB | +5.3 dBv | +5.5 dBv |

While the foregoing description represents preferred embodiments of the present invention, it will be obvious to those skilled in the art that various changes and modifications may be made, without departing from the true spirit and scope of the present invention.

What is claimed is:

1. A noise trap circuit, comprising:
  input terminal means for connecting with an input signal from a signal source, the input signal including relatively large signals and noise comprised of relatively small signals;
  output terminal means;
  blocking means connected between said input and said output terminal means, for establishing a high impedance path between said input and said output terminal means to the small signals forming said noise in the input signal, and for establishing a low impedance path between said input and said output terminal means to the large signals in said input signal;
  shunt means associated with said output terminal means, for establishing a low impedance shunt to attenuate substantially said small signals at said output terminal means when said shunt means is in an on state, and for allowing said large signals to appear substantially unattenuated at said output terminal means when said shunt means is in an off state; and
  feedback means coupled to said shunt means for sensing said large signals in the input signal, and for maintaining said shunt means in said on state in the absence of said large signals and maintaining said shunt means in said off state when said large signals are sensed;
  wherein said output terminal means provides said relatively large signals absent said noise.

2. A noise trap circuit according to claim 1, wherein said blocking means comprises diodes and said shunt means comprises field effect transistors (FETs).

3. A noise trap circuit according to claim 1, wherein said blocking means and said shunt means each comprises FETs, and said control means is also coupled to said blocking means to change an operating state of the FETs forming said blocking means in accordance with said input signal.

4. A noise trap circuit, comprising:
  a first input terminal and a second input terminal for connecting with an input signal from a signal source, the input signal including relatively large signals and noise comprised of relatively small signals;
  a first output terminal and a second output terminal;
  blocking means connected between said first input terminal and said first output terminal, for establishing a high impedance path between said first input and said first output terminals to the small signals forming said noise in the input signal, and for establishing a low impedance path between said first input and said first output terminals to the large signals in said input signal;

shunt means connected between said first and said second output terminals, for establishing a low impedance shunt between said output terminals to said small signals forming said noise when said shunt means is in an on state, and for allowing said large signals to appear substantially unattenuated at said output terminals when said shunt means is in an off state;

feedback means coupled to said shunt means for sensing said large signals in the input signal, and for maintaining said shunt means in said on state in the absence of said large signals and maintaining said shunt means in said off state when said large signals are sensed; and conductor means for connecting said second input terminal to said second output terminal;

wherein said first and said second output terminals provide said relatively large signals absent said noise.

5. A noise trap circuit according to claim 4, wherein said blocking means comprises two diodes connected in parallel relation with an anode of one diode connected to a cathode of the other diode.

6. A noise trap circuit according to claim 4, wherein said shunt means comprises two field effect transistors (FETs) connected in series relation with corresponding channel electrodes of the FETs connected directly to associated ones of said first and said second output terminals.

7. A noise trap circuit according to claim 6, wherein said feedback means includes a resistor connected between the remaining channel electrodes of said two FETs.

8. A noise trap circuit according to claim 7, wherein said feedback means includes bias means coupled to a gate electrode of each of said two FETs for maintaining a gate-to- source electrode voltage on each FET above a turn-on threshold voltage level in the absence of said large signals, and wherein said resistor is connected to said bias means so that a voltage produced across said resistor when said large signals are present serves to reduce the gate-to-source electrode voltage on at least one of the FETs.

9. A noise trap circuit according to claim 8, wherein said bias means includes a direct current (DC) bias voltage supply, and two transistors each of which has a collector electrode connected to a gate electrode of a corresponding one of the two FETs, an emitter electrode connected to the source electrode of the corresponding FET and one side of said resistor, and a base electrode connected to the opposite side of said resistor, so that the voltage produced across said resistor when said large signals are present serves to place at least one of said two transistors in a conductive state and to place the corresponding FET in a current blocking state.

10. A noise trap circuit, comprising:
a first input terminal and a second input terminal for connecting with an input signal from a signal source, the input signal including relatively large signals and noise comprised of relatively small signals;
a first output terminal and a second output terminal;
first blocking means connected between said first input terminal and said first output terminal, and second blocking means connected between said second input terminal and said second output terminal, wherein said first and said second blocking means are each arranged to establish high impedance paths between the associated input and output terminals to the small signals forming said noise in the input signal, and to establish low impedance paths between said associated input and output terminals to the large signals in said input signal;

shunt means connected between said first and said second output terminals, for establishing a low impedance shunt between said output terminals to said small signals forming said noise when said shunt means is in an on state, and for allowing said large signals to appear substantially unattenuated at said output terminals when said shunt means is in an off state; and control means coupled to said first and said second blocking means and to said shunt means, for sensing said large signals in the input signal and for controlling operation of both blocking means and the state of said shunt means according to whether or not said large signals are sensed;

wherein said first and said second output terminals provide said relatively large signals absent said noise.

11. The noise trap circuit according to claim 10, wherein said first and said second blocking means each comprises a field effect transistor (FET).

12. A noise trap circuit according to claim 11, wherein said shunt means comprises a pair of FETs.

13. A noise trap circuit according to claim 12, wherein the pair of FETs of said shunt means have corresponding channel electrodes connected directly to one another, and the remaining channel electrodes of the FETs are connected directly to associated ones of said first and said second output terminals.

14. A noise trap circuit according to claim 12, wherein the channel of the pair of FETs of said shunt means are both of one type among p type and n type, and the channels of the FETs of both blocking means are of the other type.

15. A noise trap circuit according to claim 12, wherein said control means includes transformer means for inductively sensing the input signal as applied to said first input terminal, discrimination means coupled to said transformer means for producing a control output signal when the level of the input signal exceeds a certain threshold corresponding to the presence of said large signals, and bias means responsive to said control output signal and coupled to the gate electrodes of each of the FETs forming said shunt mean and said first and said second blocking means, for switching the gate-to-source electrode voltages of the FETs and placing each of the FETs selectively in one of a conductive state and a current blocking state.

16. A low noise electro-acoustic system, comprising:
a plurality of electro-acoustic transducers forming a transducer array for transmitting an ultrasonic wave toward an object, and for receiving corresponding echo waves reflected by the object;
a plurality of power amplifier means each for supplying a relatively large drive signal to a different one of said transducers when in a transmit mode, each of said power amplifier means producing noise comprised of relatively small signals when in a receive mode,
receiver means having an input coupled to said transducer array for detecting said echo waves and providing information corresponding to the object location when in said receive mode, and a plurality of noise trap means each coupled between a different one of said power amplifier means and an associated one of said transducers, for suppressing the noise produced by each of said amplifier means when in said receive mode from appearing at the input of said receiver means, each of said noise trap means comprising:

input terminal means for connecting with an output of an associated power amplifier means;

output terminal means;

blocking means connected between said input and said output terminal means, for establishing a high impedance path between said input and said output terminal means to the noise produced by said amplifier means, and for establishing a low impedance path between said input and said output terminal means to the drive signal produced by said amplifier means;

shunt means associated with said output terminal means, for establishing a low impedance shunt to attenuate substantially said noise at said output terminal means when said shunt means is in an on state, and for allowing said drive signal to appear substantially unattenuated at said output terminal means when said shunt means is an off state; and means coupled to said shunt means for sensing said drive signal, and for maintaining said shunt means in said on state in the absence of said drive signal and maintaining said shunt means in said off state when said drive signal is sensed;

wherein said output terminal means provide said drive signal from said power amplifier means absent said noise.

17. The low noise electro-acoustic system of claim 16, wherein said blocking means comprises diodes and said shunt means comprises field effect transistors (FETs).

18. The low noise electro-acoustic system of claim 16, wherein said blocking means and said shunt means each comprises FETs, and said control means is also coupled to said blocking means to change an operating state of the FETs forming said blocking means in accordance with the output of said power amplifier means.

19. A low noise electro-acoustic system, comprising:

a plurality of electro-acoustic transducers forming a transducer array for transmitting an ultrasonic wave toward an object, and for receiving corresponding echo waves reflected by the object;

a plurality of power amplifier means each for supplying a relatively large drive signal to a different one of said transducers when in a transmit mode, each of said power amplifier means producing noise comprised of relatively small signals when in a receive mode;

receiver means having an input coupled to said transducer array for detecting said echo waves and providing information corresponding to the object location when in said receive mode; and a plurality of noise trap means each coupled between a different one of said power amplifier means and an associated one of said transducers, for suppressing the noise produced by each of said amplifier means when in said receive mode from appearing at the input of said receiver means, each of said noise trap means comprising:

a first input terminal and a second input terminal for connecting with an output of an associated power amplifier means;

a first output terminal and a second output terminal;

first blocking means connected between said first input terminal and said first output terminal, and second blocking means connected between said second input terminal and said second output terminal, wherein said first and said second blocking means are each arranged to establish high impedance paths between the associated input and output terminals to said noise produced by the power amplifier means, and to establish low impedance paths between said associated input and output terminals to the drive signal of said amplifier means;

shunt means connected between said first and said second output terminals, for establishing a low impedance shunt between said output terminals to said noise when said shunt means is in an on state, and for allowing said drive signal to appear substantially unattenuated at said output terminals when said shunt means is in an off state; and control means coupled to said first and said second blocking means and to said shunt means, for sensing said drive signal from said amplifier means and for controlling operation of both blocking means and the state of said shunt means according to whether or not said drive signal is sensed;

wherein said first and said second output terminals provide said drive signal from said power amplifier means absent said noise.

20. The low noise electro-acoustic system of claim 19, wherein said first and said second blocking means each comprises a field effect transistor (FET).

21. The low noise electro-acoustic system of claim 20, wherein said shunt means comprises a pair of FETs.

22. The low noise electro-acoustic system of claim 20, wherein the pair of FETs of said shunt means have corresponding channel electrodes connected directly to one another, and the remaining channel electrodes of the FETs are connected directly to associated ones of said first and said second output terminals.

23. The low noise electro-acoustic system of claim 21, wherein the channels of the pair of FETs of said shunt means are both of one type among p type and n type, and the channels of the pair of FETs of both blocking means are of the other type.

24. The low noise electro-acoustic system of claim 21, wherein said control means includes transformer means for inductively sensing the output of said power amplifier means as applied to said first input terminal, discrimination means coupled to said transformer means for producing a control output signal when the level of the power amplifier output signal exceeds a certain threshold corresponding to the presence of said drive signal, and bias means responsive to said control output signal and coupled to the gate electrodes of each of the FETs forming said shunt means and said first and said second blocking means, for switching the gate-to-source electrode voltages of the FETs and placing each of the FETs selectively in one of a conductive state and a current blocking state.

* * * * *